United States Patent
Chung et al.

(10) Patent No.: US 10,274,844 B1
(45) Date of Patent: Apr. 30, 2019

(54) LITHOGRAPHY APPARATUS AND METHOD FOR PROTECTING A RETICLE

(71) Applicant: Taiwan Semiconductor Manufacturing Co., Ltd., Hsinchu (TW)

(72) Inventors: Jen-Yang Chung, Penghu County (TW); Chieh Hsieh, Taoyuan (TW); Shang-Chieh Chien, New Taipei (TW); Li-Jui Chen, Hsinchu (TW); Po-Chung Cheng, Zhongpu Township, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/821,932

(22) Filed: Nov. 24, 2017

(51) Int. Cl.
  *G03B 27/42* (2006.01)
  *G03F 7/20* (2006.01)

(52) U.S. Cl.
  CPC ...... *G03F 7/70733* (2013.01); *G03F 7/70708* (2013.01); *G03F 7/70725* (2013.01)

(58) Field of Classification Search
  CPC ........ G03F 7/20; G03F 7/70691; G03F 7/707; G03F 7/70716; G03F 7/70725; G03F 7/70733; H01L 21/0274; H01L 21/0337
  See application file for complete search history.

(56) References Cited

U.S. PATENT DOCUMENTS

| | | | |
|---|---|---|---|
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 2005/0083499 A1* | 4/2005 | Van De Ven | G03F 7/707 355/53 |
| 2010/0195080 A1* | 8/2010 | Compen | G03F 7/707 355/72 |

* cited by examiner

*Primary Examiner* — Mesfin T Asfaw
(74) *Attorney, Agent, or Firm* — McClure, Qualey & Rodack, LLP

(57) ABSTRACT

A lithography apparatus is provided. The lithography apparatus includes a reticle stage. The reticle stage includes a main base, an electrostatic chuck and a safety protecting device. The electrostatic chuck is disposed on the main base and configured to generate an electrostatic force for holding a reticle. The safety protecting device is connected to the main base and is configured to generate a pushing force toward the reticle when the electrostatic force generated by the electrostatic chuck is interrupted.

20 Claims, 14 Drawing Sheets

LITHOGRAPHY APPARATUS AND METHOD FOR PROTECTING A RETICLE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor wafer, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that take up less space than the packages used in the past, in some applications.

During the manufacturing of the semiconductor devices, various processing steps are used to fabricate integrated circuits on a semiconductor wafer.

As semiconductor technologies evolve, advanced lithography techniques have been widely used in today's integrated circuit fabrication processes. Photolithographic techniques involve forming a photoresist layer over a substrate, exposing portions of the photoresist material to a pattern of light in accordance with a desired pattern, developing the photoresist material to remove portions of the photoresist material to expose portions of the underlying material. A suitable etching process such as dry etching, wet etching and/or the like may then be performed on the substrate. As a result, the exposed underlying material may be removed in accordance with the desired pattern.

The exposure step of the lithography process may involve a variety of reticles (such as photomask). The lithography process of the integrated circuit may comprise multiple photolithography process steps due to the complexity of the manufacturing process. Each lithography step may employ a reticle through which the pattern of a component of an integrated circuit is generated.

Although existing lithography systems and processes have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
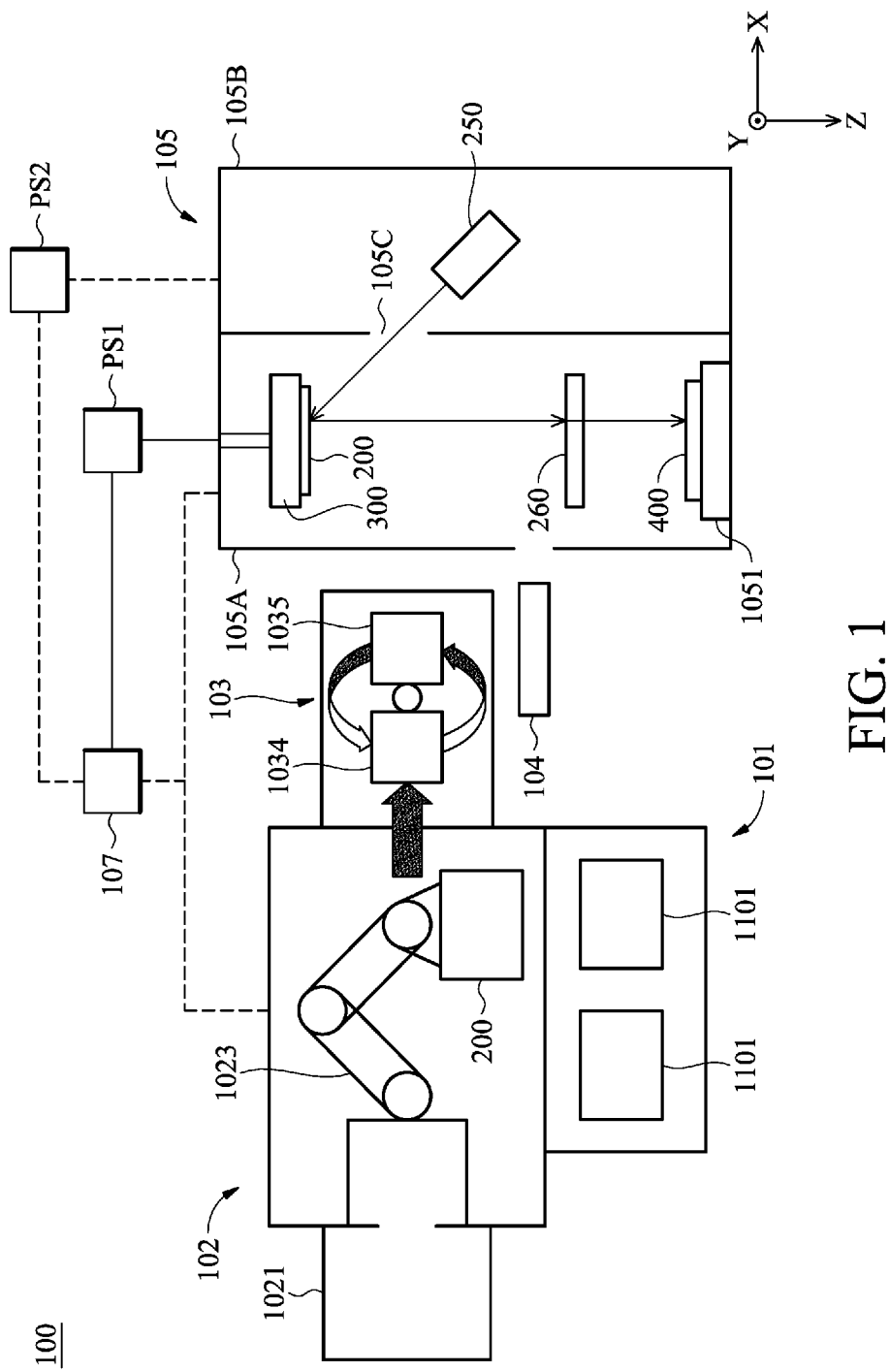
FIG. 1 shows a schematic view of a semiconductor manufacturing apparatus according to some embodiments of the disclosure.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and the second features are formed in direct contact, and may also include embodiments in which additional features may be formed between the first and the second features, such that the first and the second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (Fin-FETs). For example, the fins may be patterned to produce a relatively close spacing between features, for which the above disclosure is well suited. In addition, spacers used in forming fins of FinFETs can be processed according to the above disclosure.

FIG. 1 shows a schematic view of a semiconductor manufacturing system 100 according to some embodiments of the disclosure. In some embodiments, the semiconductor manufacturing system 100 includes a load port 101, a transferring module 102, a switching module 103, a transportation stage 104, a processing apparatus 105, a control module 107 and a first power source PS1 and a second power source PS2. Elements of the semiconductor manufacturing system 100 can be added to or omitted, and the invention should not be limited by the embodiments. In some embodiments, the semiconductor manufacturing system 100 is a lithography processing system and the processing apparatus 105 is a lithography apparatus. The semiconductor manufacturing system 100 is configured to use a high-brightness light to expose a photoresist layer coated on the semiconductor wafer. The semiconductor manufacturing system 100 may be generically referred to as a scanner that is operable to perform lithography exposure process with respective high-brightness light source and exposure mode.

In some embodiments, the semiconductor manufacturing system 100 further includes a reticle 200 (or photomask) which to be located in the processing apparatus 105. The load port 101 is configured to load a reticle 200 from a carrier 1011 into the transferring module 102 or remove a reticle 200 from the transferring module 102 to the carrier 1011. In some embodiments, the load port 101 is able to place two carriers 1011, but the number of the carriers is not limited thereto. In this embodiment, one of the two carriers 1011 is used to carry the reticle 200 which are going to be transported into the transferring module 102, and another one is used to carry another reticle 200 which are removed from the transferring module 102.

The transferring module 102 is configured to deliver the reticle 200 between the load port 101 and the switching module 103. In some embodiments, the transferring module 102 is positioned between the load port 101 and the switching module 103. The transferring module 102 may include a control circuit 1021 and a robotic arm 1023. The control circuit 1021 is configured to generate an electrical signal to the robotic arm 1023, so as to control the robotic arm 1023 to deliver the reticle 200. In some embodiments, the robotic arm 1023 may include a six-axis robot manipulator and is configured for grapping the reticle 200.

Figure 2:
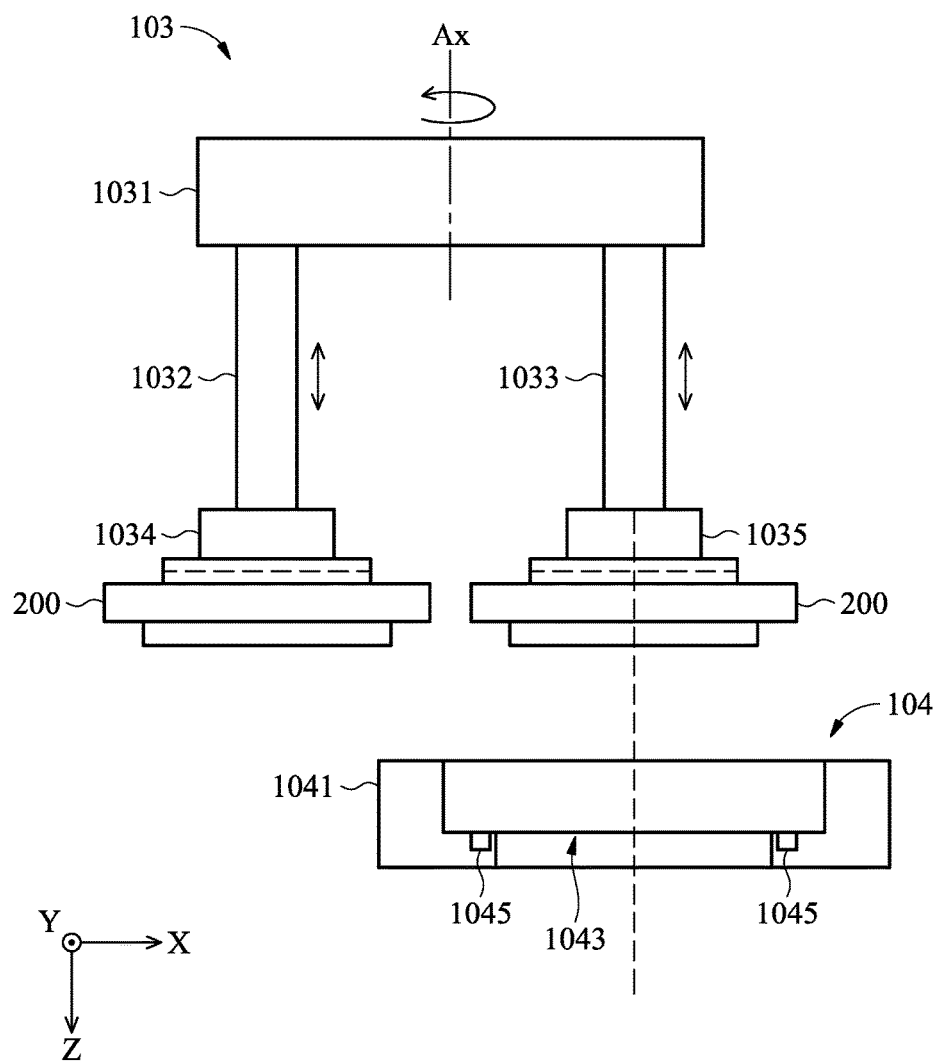
FIG. 2 is a diagram of a transportation stage viewed along the Y-axis according to some embodiments of the disclosure.

The switching module 103 is configured for gripping the reticle 200 before the reticle 200 is moved to the transportation stage 104 and after another reticle 200 is removed from the transportation stage 104. Please refer to FIG. 2, which is a diagram of the transportation stage 104 viewed along the Y-axis according to some embodiments of the disclosure. As shown in FIG. 2, the switching module 103 includes a base 1031, two elevators 1032 and 1033 and two carrier heads 1034 and 1035. The two elevators 1032 and 1033 are connected to the bottom surface of the base 1031. The two carrier heads 1034 and 1035 are respectively connected to two ends of the two elevators 1032 and 1033. The base 1031 is configured to be moved around the rotation an axis Ax (parallel to the Z-axis), and each of the two elevators 1032 and 1033 is able to independently move along a vertical direction (parallel to the Z-axis) relative to the base 1031 as indicated by the arrows shown in FIG. 2. The two carrier heads 1034 and 1035 are configured to grip the reticle 200 by suitable means. For example, the two carrier heads 1034 and 1035 are connected to a vacuum source, and the reticle 200 are mounted on the bottom surfaces of the two carrier heads 1034 and 1035 by the vacuum. However, it should be noted that many variations and modifications can be made to embodiments of the disclosure.

In some embodiments, the transportation stage 104 is used for conveying the reticle 200 in ultraviolet (UV) or deep ultraviolet (DUV) lithography. The transportation stage 104 includes a main body 1041 and two clamping mechanisms 1045. The main body 1041 is penetrated by an opening 1043. The dimension of the opening 1043 may be modified according the size of the reticle 200 which is going to be conveyed. In some embodiments, the two clamping mechanisms 1045 are positioned at two opposite sides of the opening 1043 for clamping the reticle 200. However, it should be noted that many variations and modifications can be made to embodiments of the disclosure.

In some embodiments, the transportation stage 104 is used for conveying the reticle 200 in EUV lithography. The opening 1043 is omitted, and there are two or more than two clamping mechanisms 1045 positioned at the contacting surface of the main body 1041 which is in contact with a backside surface of the reticle 200.

In some embodiments, the first power source PS1 as shown in FIG. 1 provides electricity to the elements in the semiconductor manufacturing system 100, and the control module 107 is configured to control the operation of devices of the semiconductor manufacturing system 100. In some embodiments, the control module 107 can be a computer that communicates with the variant devices and elements of the semiconductor manufacturing system 100 by a wired or wireless communication network. For example, the control module 107 is electrically connected to the switching module 103 and the transportation stage 104, and the operation of the switching module 103 and the transportation stage 104 is controlled by the control module 107. In addition, the control module 107 and the control circuit 1021 can be integrated into a control unit. In this embodiment, the control module 107 and the control circuit 1021 are powered by the first power source PS1, but they are not limited thereto. For example, in other embodiments, when the first power source PS1 does not provide the control module 107 and the lithography apparatus 105 with electricity, the control module 107 can be powered by the second power source PS2 which is independent and different from the first power source PS 1, and the second power source PS2 can provide some elements of the lithography apparatus 105 with electricity. In some embodiments, the first power source PS1 and the control module 107 are not disposed in the lithography apparatus 105. In other embodiments, the first power source PS1 and the control module 107 can be integrated into the lithography apparatus 105. In addition, in some embodiments, the second power source PS2 can also be integrated into the lithography apparatus 105.

As shown in FIG. 1, the processing apparatus 105 can include a lithography chamber 105A and a light source chamber 150B, and the lithography chamber 105A is communicated to the light source chamber 150B through a valve 105C. The lithography chamber 105A can include a reticle stage 300, a wafer stage 1051 and a projection optics module 260 (or projection optics box (POB)). The reticle stage 300 is configured to receive and hold the reticle 200. The wafer stage 1051 is configured to receive and hold a semiconductor wafer 400.

In this embodiment, a light source 250 is disposed in the light source chamber 150B and can generate an Extreme Ultraviolet (EUV) light. The EUV light travels through the valve 105C and reflected by the reticle 200 onto the semiconductor wafer 400, so as to define a pattern of the reticle 200 (photomask) on the semiconductor wafer 400. The projection optics module 260 is disposed on the path through which the EUV light travels. For example, the projection optics module 260 is disposed between the reticle 200 and the semiconductor wafer 400 in this embodiment, but it is not limited thereto. The light source 250 is configured to generate radians having a wavelength ranging between about 1 nm and about 100 nm. In one particular example, the high-brightness light source 15 generates an EUV light with a wavelength centered at about 13.5 nm. Accordingly, the light source 250 is also referred to as EUV light source. In another embodiment, the projection optics module 260 can also be disposed between the reticle 200 and the light source 250. The light generated by the light source 250 is not limited to EUV light. The light source 250 can be utilized to perform any high-intensity photon emission from excited target material. For example, the light source 250 may include a high-brightness light source, such as an ultraviolet (UV) source or a deep ultra-violet (DUV) source.

Figure 3:
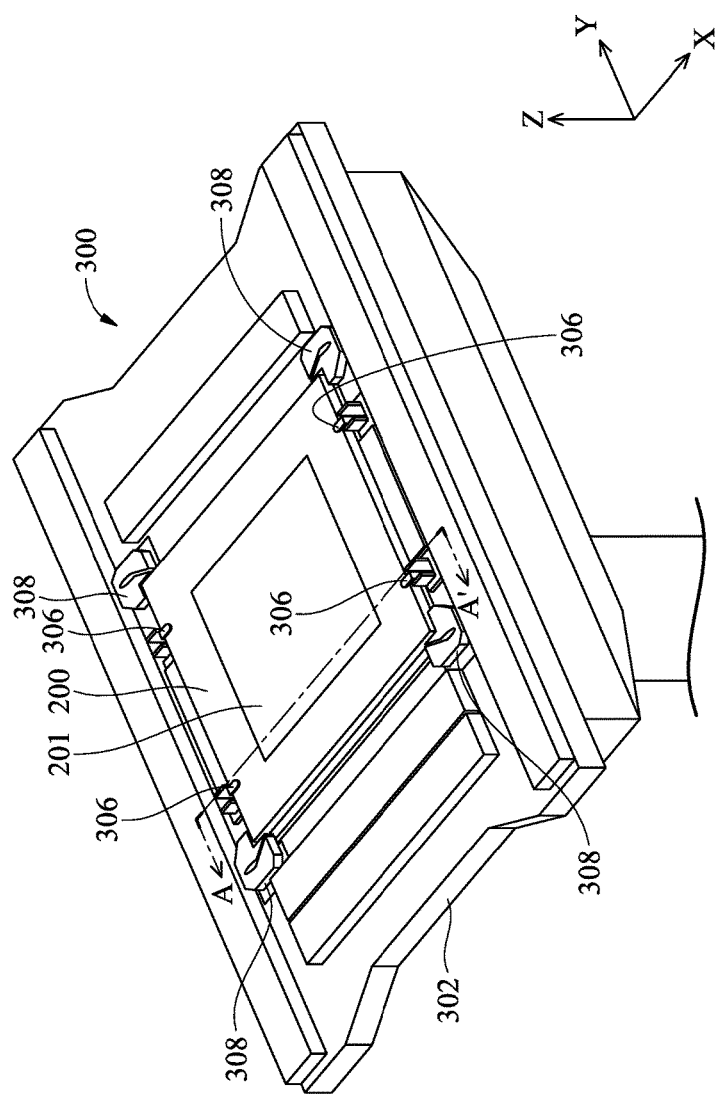
FIG. 3 is a schematic diagram of the reticle disposed on the reticle stage in FIG. 1 according to some embodiments of the disclosure.
Figure 4:
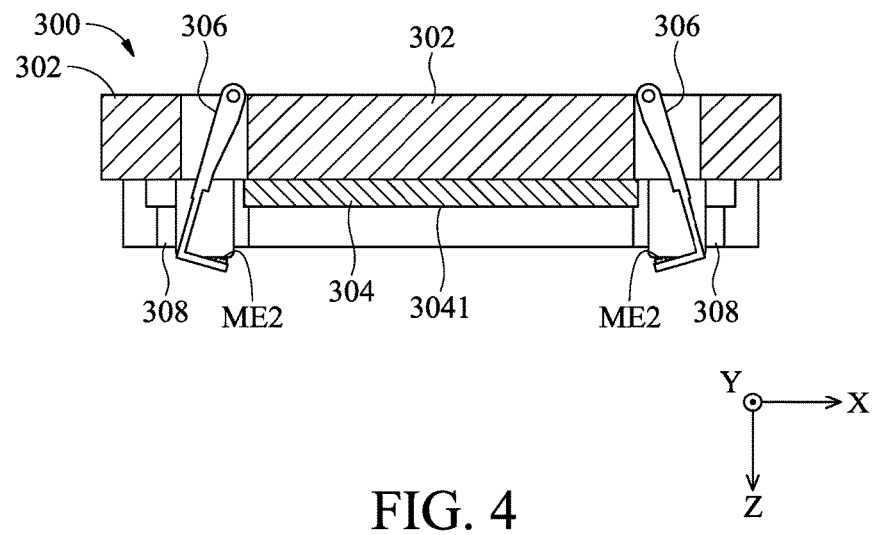
FIG. 4 is a diagram of the reticle stage viewed along line A-A' in FIG. 3 according to some embodiments of the disclosure.

Please refer to FIG. 3 and FIG. 4. FIG. 3 is a schematic diagram of the reticle 200 disposed on the reticle stage 300 in FIG. 1 according to some embodiments of the disclosure. FIG. 4 is a diagram of the reticle stage 300 viewed along line A-A' in FIG. 3 according to some embodiments of the disclosure. As shown in FIG. 3 and FIG. 4, the reticle stage 300 includes a main base 302, an electrostatic chuck 304, four safety protectors 306 and four constraining portions 308. The electrostatic chuck 304 is disposed on the main base 302 and is electrically connected to the first power source PS1. When the first power source PS1 provides a voltage to the electrostatic chuck 304, a contacting surface 3041 of the electrostatic chuck 304 is arranged with electric charges, so as to generate an electrostatic force to hold or secure the reticle 200.

As shown in FIG. 4, the four safety protectors 306 are connected to the main base 302 (only two safety protectors 306 are shown in FIG. 4 because of the angle of view). In particular, the safety protectors 306 are pivotally connected to the main base 302 and are controlled by the control module 107. The control module 107 utilizes some mechanical elements (such as motors or tracks, not shown in the figures) to control the safety protectors 306 to switch between an open state and a closed state. Before the reticle 200 is held or secured by the electrostatic chuck 304, the control module 107 controls the safety protectors 306 in the open state as shown in FIG. 4.

When the reticle 200 is conveyed by the transportation stage 104 from the switching module 103 to the reticle stage 300 in the processing apparatus 105, the first power source PS1 provides a voltage to the electrostatic chuck 304, and then the surface of the electrostatic chuck 304 is arranged with electric charges (such as positive electric charges). Accordingly, the surface of the reticle 200 facing the reticle stage 300 is also arranged with electric charges (such as negative electric charges), so that the electrostatic force is generated between the reticle stage 300 and the reticle 200. Therefore, the reticle 200 is affixed to the reticle stage 300 by the electrostatic force, and the lithography process is performed.

Figure 5:
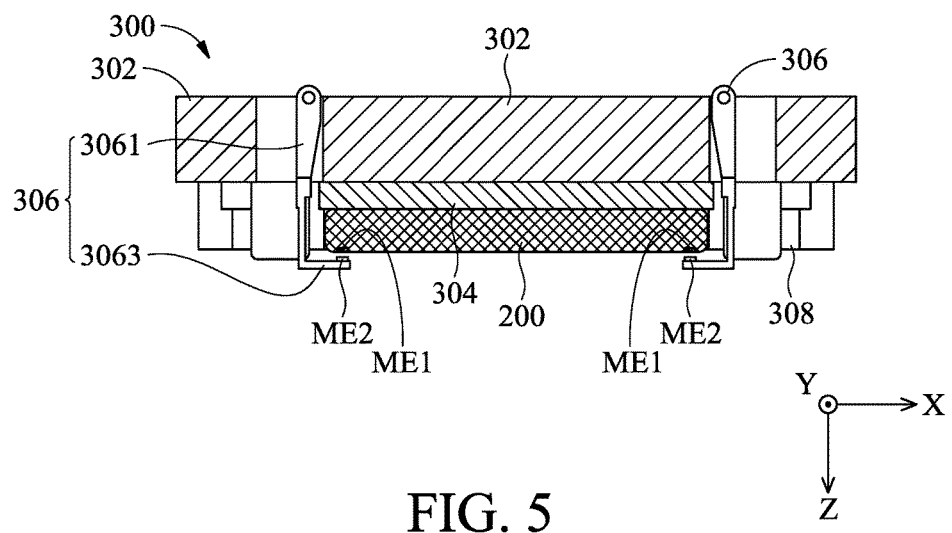
FIG. 5 is a diagram of the reticle held by the reticle stage viewed along the Y-axis according to some embodiments of the disclosure.

Please refer to FIG. 1 and FIG. 5. FIG. 5 is a diagram of the reticle 200 held by the reticle stage 300 viewed along the Y-axis according to some embodiments of the disclosure. After the reticle 200 is held by the reticle stage 300, as shown in FIG. 5, the control module 107 controls the safety protectors 306 to switch from the open state to the closed state. In addition, as shown in FIG. 3, when the reticle 200 is held by the reticle stage 300, the four constraining portions 308 are configured to constrain the reticle 200 along a plane (such as the XY plane) parallel to the electrostatic chuck 304. Then, the reticle 200 is positioned on and held by the electrostatic chuck 304 of the reticle stage 300. In some embodiments, the constraining portions 308 can be made of a resilient material, so as to prevent from causing damage to the reticle 200 if the reticle 200 is in contact with the constraining portions 308.

Figure 6:
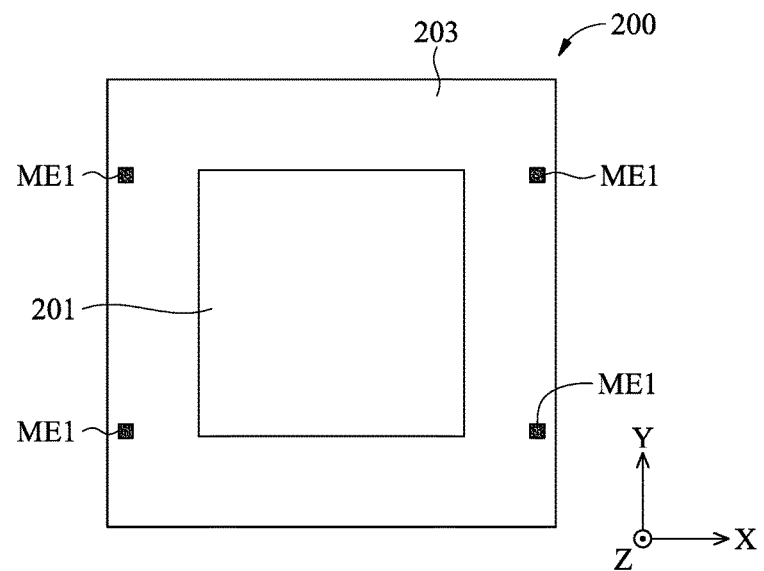
FIG. 6 is a plane view of the reticle when viewed along the Z-axis according to some embodiments of the disclosure.
Figure 7:
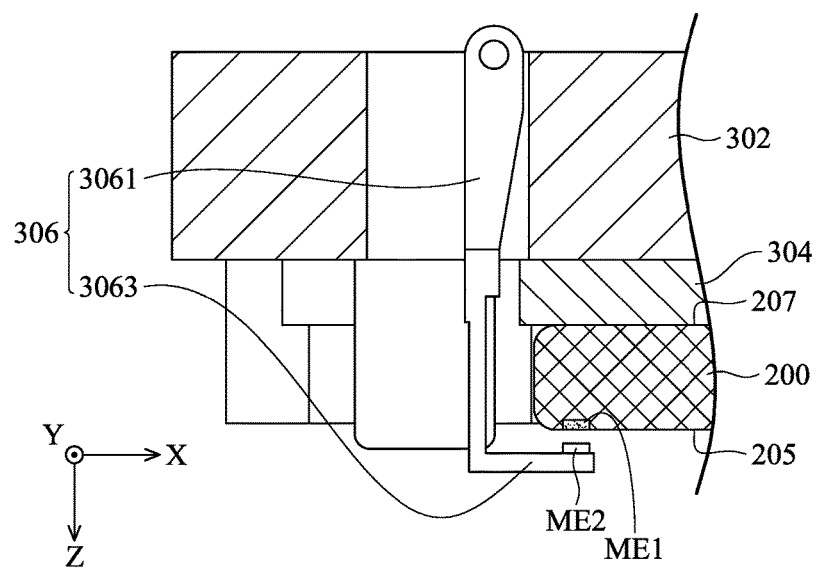
FIG. 7 is an enlarged diagram of the reticle stage and the reticle in FIG. 5 according to some embodiments of the disclosure.

Please refer to FIG. 5 to FIG. 7 together. FIG. 6 is a plane view of the reticle 200 when viewed along the Z-axis according to some embodiments of the disclosure. FIG. 7 is an enlarged diagram of the reticle stage 300 and the reticle 200 in FIG. 5 according to some embodiments of the disclosure. As shown in FIG. 5 and FIG. 7, each of the safety protectors 306 can include a connecting portion 3061 and a bent portion 3063. One end of the connecting portion 3061 is connected to the main base 302 in some manner. For example, the connecting portion 3061 is pivotally connected to the main base 302. The other end of the connecting portion 3061 extended in the Z-axis (a first direction) and is connected to the bent portion 3063. The bent portion 3063 is extended along the X-axis (a second direction). In this embodiment, the included angle between the bent portion 3063 and the connecting portion 3061 is substantially 90 degrees, but it is not limited thereto.

When certain accidents occur, such as the electrostatic chuck 304 not being supplied with voltage by the first power source PS1, the reticle 200 may become separated from the electrostatic chuck 304 and fall, and the safety protectors 306 can catch the falling reticle 200 due to the design of the bent portion 3063, so as to prevent the reticle 200 from falling to the ground or colliding with other elements in the processing apparatus 105, causing damage to the reticle 200.

However, if the reticle 200 falls and is directly caught by the safety protectors 306, the reticle 200 will be in contact with the safety protectors 306, and friction between the reticle 200 and the safety protectors 306 may result in a plurality of particles. These particles may fall on the semiconductor wafer 400 below the reticle 200, and the particles may cause defects on the semiconductor wafer 400 in the lithography process, so as to affect the yield rate of the semiconductor wafer 400.

As shown in FIG. 6, in some embodiments, the reticle 200 has a rectangular structure, and the reticle 200 can define a pattern area 201 and an edge area 203. The edge area 203 surrounds the pattern area 201, and multiple patterns are formed on the pattern area 201. In this embodiment, the reticle 200 includes four first magnetic elements ME1 disposed on four corners of the edge area 203, and the positions of the first magnetic elements ME1 respectively correspond to the safety protectors 306. Furthermore, as shown in FIG. 5 and FIG. 7, a second magnetic element ME2 (such as a magnet) is disposed on the bent portion 3063 of each safety protector 306, and the second magnetic element ME2 faces the first magnetic element ME1 on the reticle 200. More specifically, the magnetic pole of the side of the second magnetic element ME2 facing the first magnetic element ME1 and the magnetic pole of the side of the first magnetic element ME1 facing the second magnetic element ME2 are the same. Therefore, a magnetic rejection force is produced between the first magnetic element ME1 and the second magnetic element ME2. In some embodiments, the safety protectors 306 and the second magnetic elements ME2 can be defined as a safety protecting device.

In some situations that the first power source PS1 has a problem and cannot provide the electrostatic chuck 304 with electricity and there is no electrostatic force between the reticle 200 and the electrostatic chuck 304 or the electrostatic force is interrupted, the reticle 200 cannot be held by the electrostatic chuck 304 and tends to be separated from the electrostatic chuck 304 by gravity. The magnetic rejection force can resist gravity and help the reticle 200 to maintain its position, or the reticle 200 can be levitated on a position between the electrostatic chuck 304 and the safety protector 306 by the magnetic rejection force and gravity of the reticle 200. For example, the reticle 200 is driven by the magnetic rejection force to be maintained at the position as shown in FIG. 7. As a result, the reticle 200 is not going to fall and is not in contact with the safety protectors 306, so that there are no particles resulting from the friction between the reticle 200 and the safety protectors 306, and the defect on the semiconductor wafer 400 due to the particle in the lithography process can be prevented, so as to increase the yield rate of the semiconductor wafer 400.

In some embodiments, the reticle 200 is made of a non-magnetic material, so that the magnetic rejection force between the first magnetic element ME1 and the second magnetic element ME2 is not interfered with. In addition, in this embodiment, the size of the first magnetic element ME1 and the size of the second magnetic element ME2 can be the same, but they are not limited thereto. For example, in some embodiments, the first magnetic element ME1 can be larger or smaller than the second magnetic element ME2.

Furthermore, as shown in FIG. 7, the reticle 200 has a first surface 205 and a second surface 207, and the first surface 205 and the second surface 207 are located on two opposite sides of the reticle 200. In this embodiment, the first magnetic element ME1 is disposed in the first surface 205 which faces the second magnetic element ME2 on the bent portion 3063 of the safety protector 306. In some embodiments, the first magnetic element ME1 can be disposed on the second surface 207 which faces the electrostatic chuck 304. The positions of the first magnetic element ME1 on the reticle 200 are according to practical design requirement.

Figure 8:
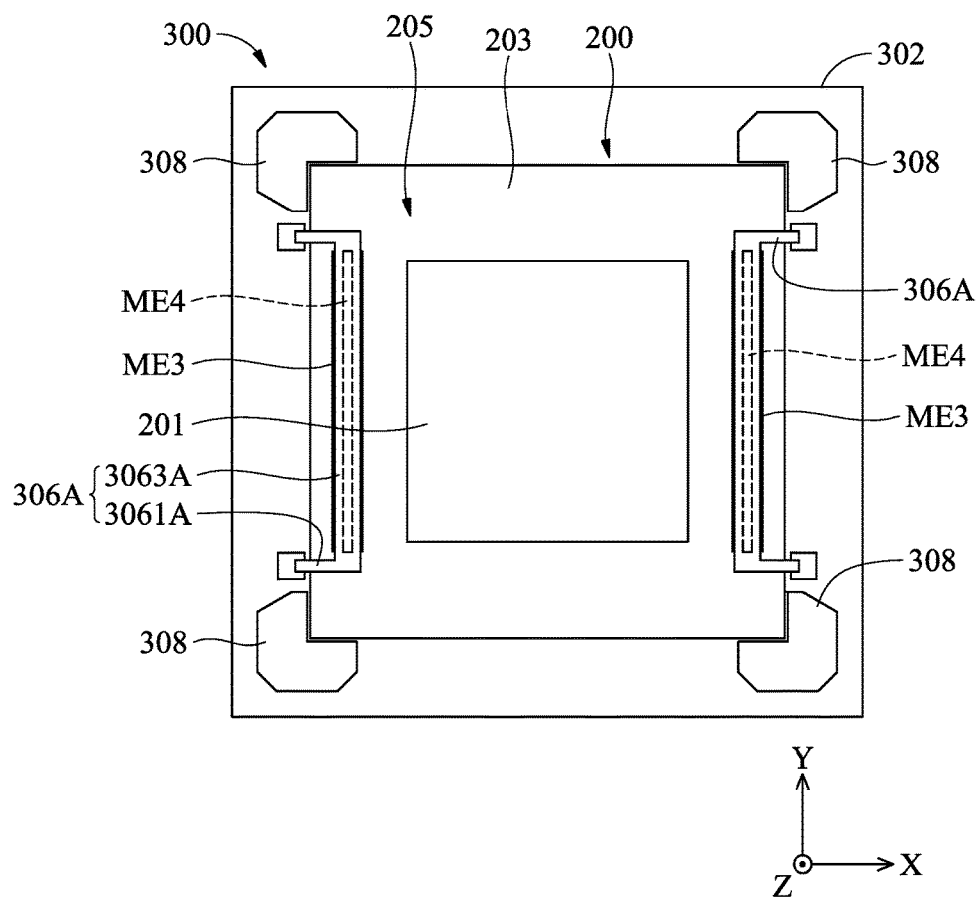
FIG. 8 is a plane view of the reticle disposed on the reticle stage when viewed along the Z-axis according to another embodiment of the disclosure.
Figure 9:
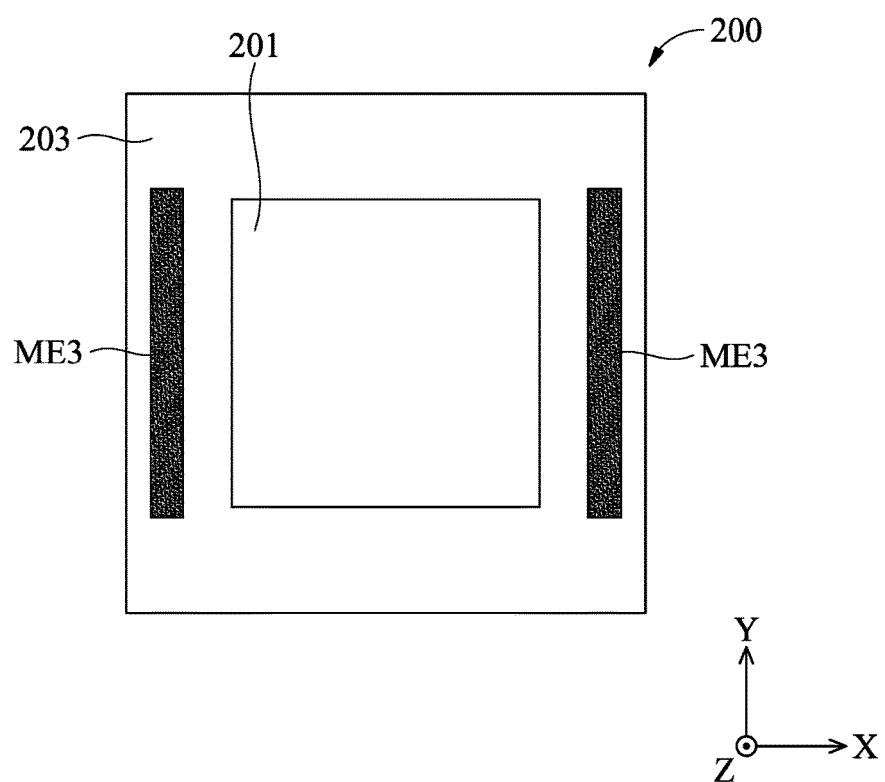
FIG. 9 is a plane view of the reticle when viewed along the Z-axis according to another embodiment of the disclosure.

Please refer to FIG. 8 and FIG. 9. FIG. 8 is a plane view of the reticle 200 disposed on the reticle stage 300 when viewed along the Z-axis according to another embodiment of the disclosure. FIG. 9 is a plane view of the reticle 200 when viewed along the Z-axis according to another embodiment of the disclosure. In this embodiment, the reticle 200 has a rectangular structure, and the reticle stage 300 includes two safety protectors 306A corresponding to two opposite sides of the first surface 205 of the reticle 200. As shown in FIG. 8, the two safety protectors 306A correspond to the left side and the right side of the reticle 200. More specifically, the safety protector 306A includes a connecting portion 3061A and a bent portion 3063A. The connecting portion 3061A is pivotally connected the main base 302, and the bent portion 3063A has a long strip structure which is parallel to the first surface 205 of the reticle 200 (such as the left side and the right side on the first surface 205 of the reticle 200 in FIG. 8).

In addition, as shown in FIG. 9, two magnet elements ME3 are respectively disposed on the two opposite sides of the reticle 200. As shown in FIG. 8, two magnetic elements ME4 are respectively disposed on the bent portions 3063A of the two safety protectors 306A, and the two magnetic elements ME4 respectively faces the two magnet elements ME3. In some embodiments, the magnet elements ME3 and the magnetic elements ME4 both have long-strip structures, so as to provide a stronger magnetic rejection force to resist gravity of reticle 200. Therefore, when the reticle 200 is not held by the electrostatic chuck 304 with the electrostatic force, the magnetic rejection force generated by the magnet elements ME3 and the magnetic elements ME4 can resist gravity and prevent the reticle 200 from falling down along the Z-axis to the safety protectors 306A or colliding with other elements. It should be noted that the size of the magnet element ME3 and the size of the magnetic element ME4 are not the same in this embodiment, but their sizes can be the same in some embodiments.

Figure 10:
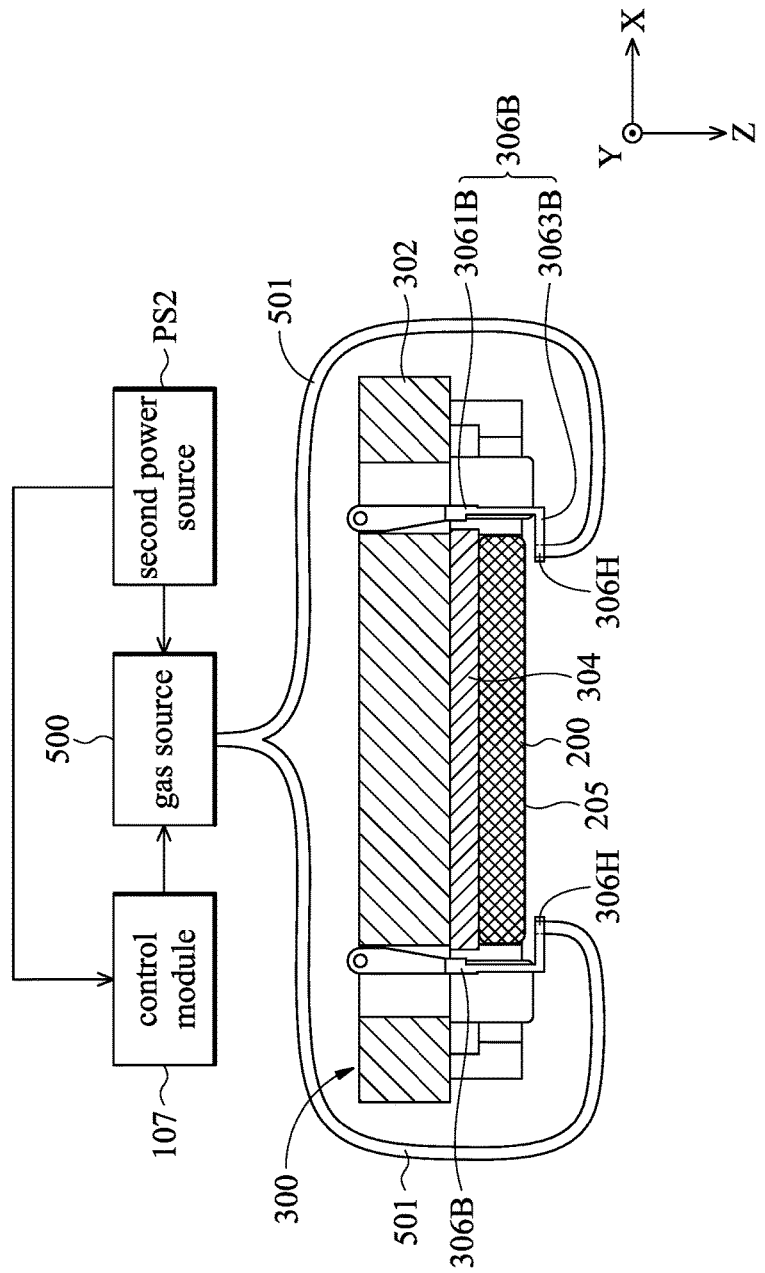
FIG. 10 and FIG. 11 are diagrams of the reticle stage, the control module, a gas source and a second power source in the semiconductor manufacturing system according to another embodiment of the disclosure.
Figure 11:
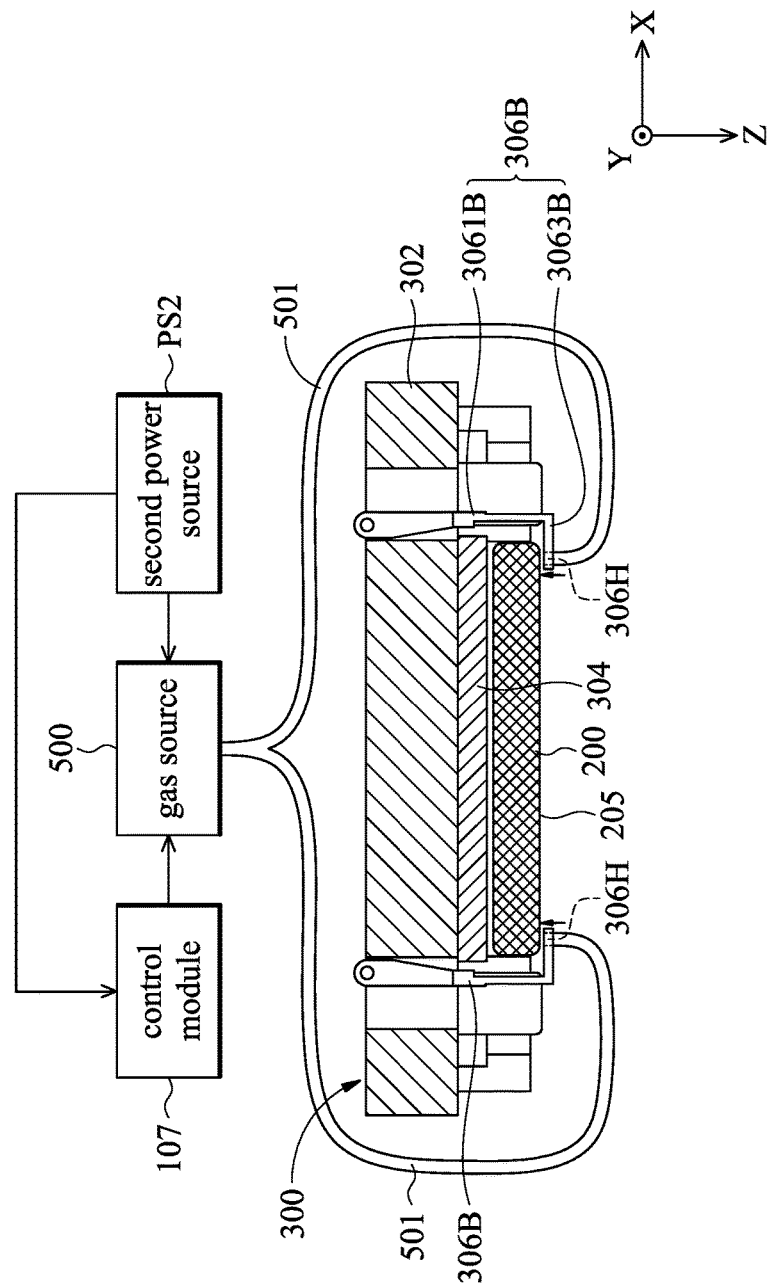

Please refer to FIG. 10 and FIG. 11. FIG. 10 and FIG. 11 are diagrams of the reticle stage 300, the control module 107, a gas source 500 and a second power source PS2 in the semiconductor manufacturing system 100 according to another embodiment of the disclosure. Similar to the embodiment of FIG. 3, the reticle stage 300 in FIG. 10 includes four safety protectors 306B, and the four safety protectors 306B corresponds to four corners of the reticle 200 (only two safety protectors 306B are shown in FIG. 10 and FIG. 11 because of the angle of view). Each safety protector 306B includes a connecting portion 3061B and a bent portion 3063B connected to the connecting portion 3061B. In this embodiment, an ejecting outlet 306H is formed on the bent portion 3063, and the gas source 500 is communicated with the ejecting outlet 306H through a gas tube 501. In some embodiments, a safety protecting device is defined to include the safety protectors 306B, and the gas tubes 501, and the gas tubes 501 receive the gas from the gas source 500. The control module 107 is electrically connected to the gas source 500 and controls the gas source 500 to eject the gas or not. The gas source 500 can include nitrogen gas ($N_2$), hydrogen gas ($H_2$), argon gas (Ar), or other inert gases. It should be noted that the gas source 500 and the control module 107 are driven by the second power source PS2, and the second power source PS2 is separated from other power source (such as the first power source PS1 in FIG. 1).

When a power source (such as the first power source PS1 in FIG. 1) provides a voltage to the electrostatic chuck 304, the electrostatic chuck 304 can hold or secure the reticle 200 by electrostatic force. In this embodiment, the control module 107 is configured to monitor whether the first power source PS1 provides the electrostatic chuck 304 with electricity or not (i.e., whether the electrostatic force generated by the electrostatic chuck 304 is interrupted or stopped). When the first power source PS1 has some problems (such as shutting down accidentally) and cannot provides the electrostatic chuck 304 with electricity, the control module 107 can detects this situation. When the control module 107 determines that the first power source PS1 does not provide the electrostatic chuck 304 with electricity (i.e., no electrostatic force is generated by the electrostatic chuck 304), the control module 107 controls the gas source 500 to eject the gas through the gas tube 501 and the ejecting outlet 306H onto the reticle 200 along the arrow direction in FIG. 11, so as to generate a pushing force to levitate the reticle 200 in the position between the electrostatic chuck 304 and the safety protector 306B. As a result, the reticle 200 is not going to fall and is not in contact with the safety protectors 306B, so that there are no particles resulting from friction between the reticle 200 and the safety protectors 306B, and the defect on the semiconductor wafer 400 due to the particle in the lithography process can be prevented, so as to increase the yield rate of the semiconductor wafer 400.

It should be noted that the second power source PS2 is an individual power source and is independent from the first power source PS1, so that when the first power source PS1 has problems and cannot work well, the second power source PS2 can still provide the gas source 500 and the control module 107 with electricity, so as to prevent the reticle 200 from falling downward.

Figure 12:
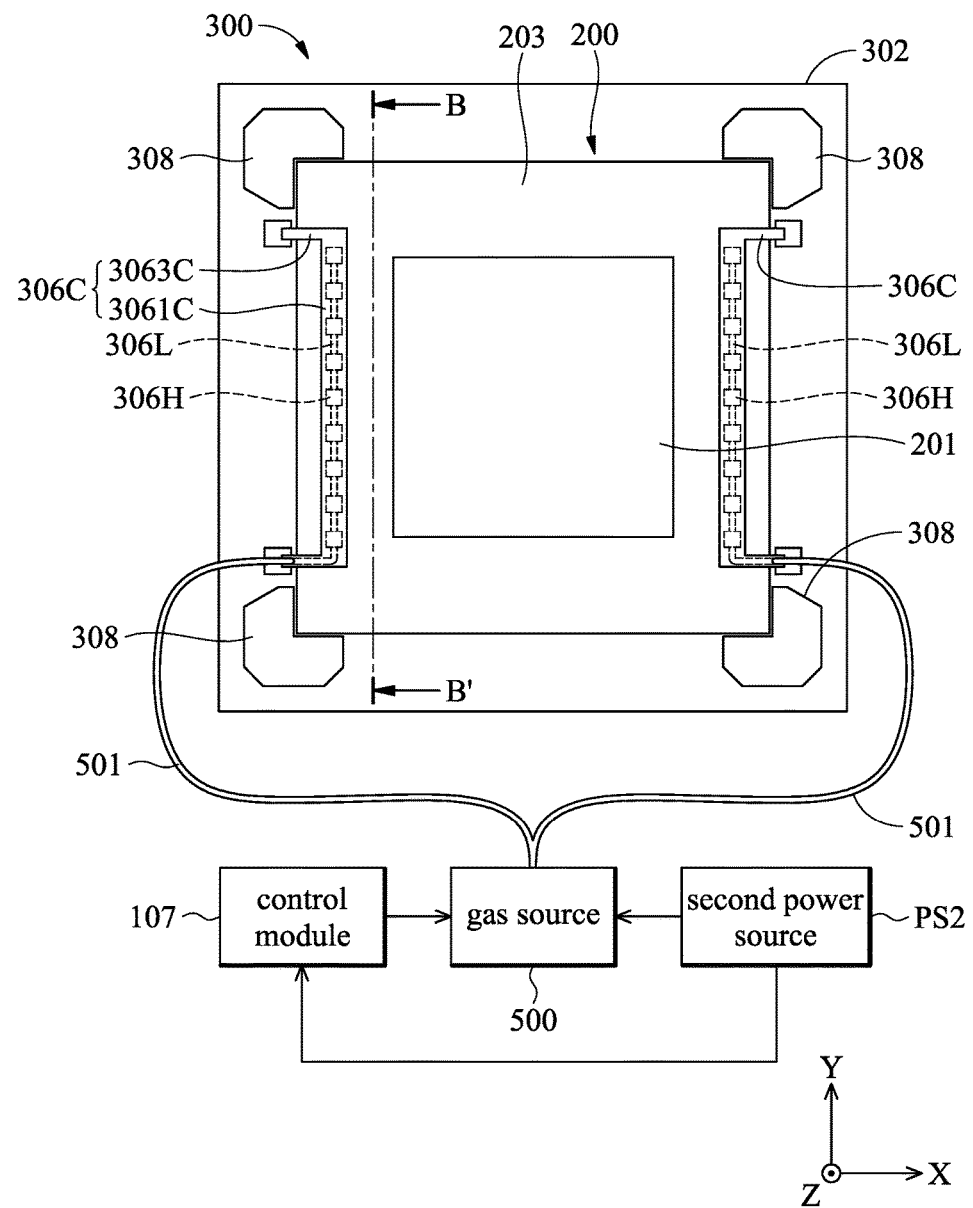
FIG. 12 is a plane view of the reticle disposed on the reticle stage when viewed along the Z-axis according to another embodiment of the disclosure.
Figure 13:
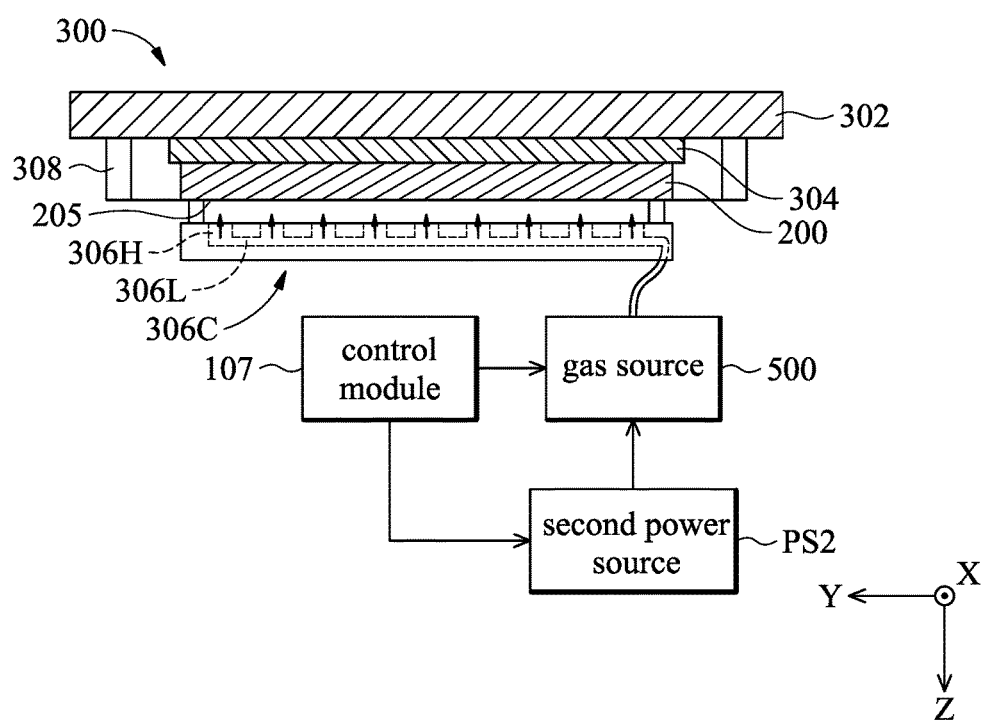
FIG. 13 is a cross-sectional view along line B-B' in FIG. 12 according to some embodiments of the disclosure.

Please refer to FIG. 12 and FIG. 13. FIG. 12 is a plane view of the reticle 200 disposed on the reticle stage 300 when viewed along the Z-axis according to another embodiment of the disclosure. FIG. 13 is a cross-sectional view along line B-B' in FIG. 12 according to some embodiments of the disclosure. In this embodiment, the reticle stage 300 includes two safety protectors 306C corresponding to two opposite sides of the reticle 200, and a plurality of ejecting outlets 306H and a communicating path 306L are formed in each safety protector 306C. These ejecting outlets 306H are communicated with the gas source 500 through the communicating path 306L.

When the control module 107 determines that the first power source PS1 does not provide the electrostatic chuck 304 with electricity, the control module 107 controls the gas source 500 to eject the gas through the communicating path 306L and the ejecting outlets 306H onto the reticle 200 along the Z-axis in FIG. 13, so as to prevent the reticle 200 from falling downward and being in contact with other elements. Based on the configuration of the plurality of ejecting outlets 306H, the reticle 200 can be pushed upward by a greater amount of the gas through those ejecting outlets 306H, so that the reticle 200 can stably remain in the original position or can be stably levitated between the electrostatic chuck 304 and the safety protectors 306C.

Figure 14:
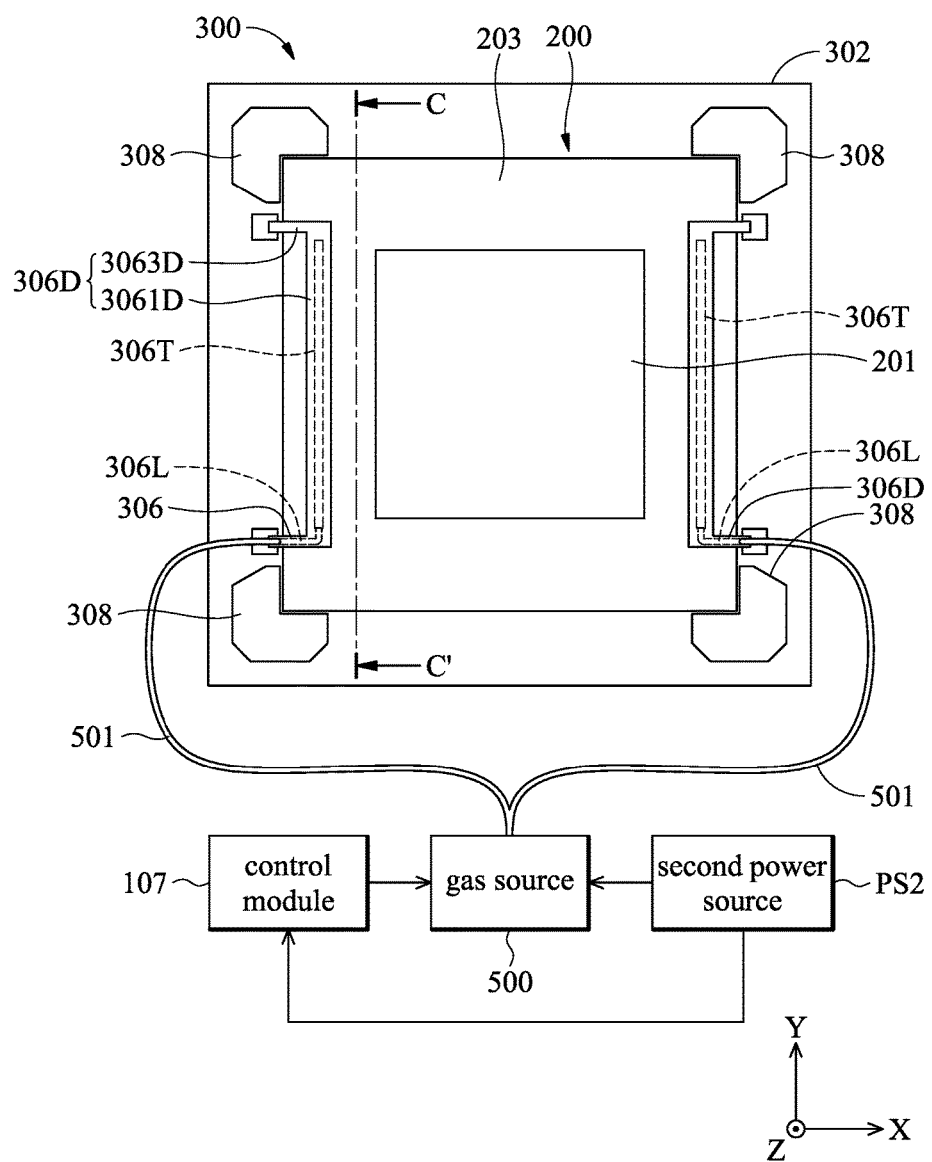
FIG. 14 is a plane view of the reticle disposed on the reticle stage when viewed along the Z-axis according to another embodiment of the disclosure.
Figure 15:
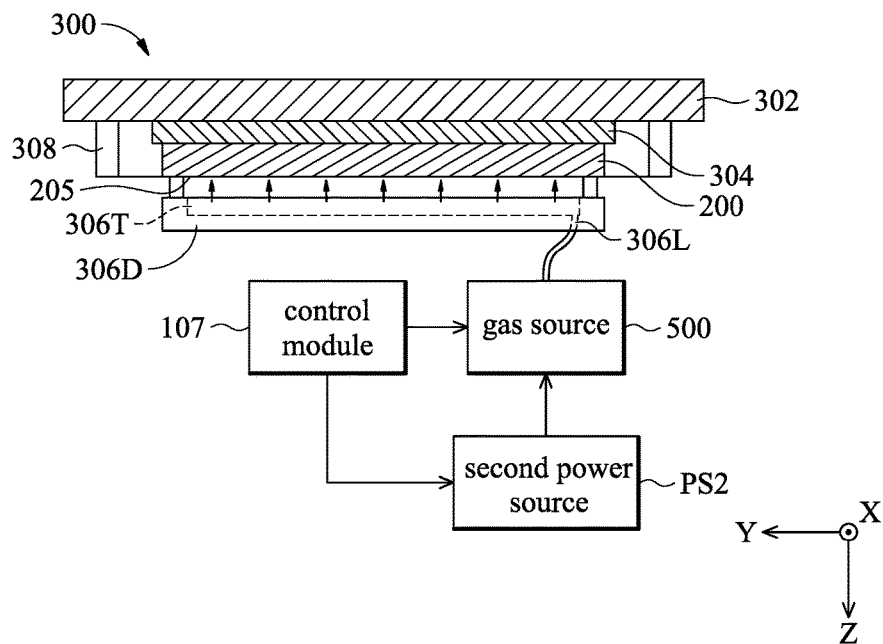
FIG. 15 is a cross-sectional view along line C-C' in FIG. 14 according to the embodiment of the disclosure.

Please refer to FIG. 14 and FIG. 15. FIG. 14 is a plane view of the reticle 200 disposed on the reticle stage 300 when viewed along the Z-axis according to another embodiment of the disclosure. FIG. 15 is a cross-sectional view along line C-C' in FIG. 14 according to the embodiment of the disclosure. In this embodiment, the reticle stage 300 includes two safety protectors 306D corresponding to two opposite sides of the reticle 200, and a trench 306T and a communicating path 306L are formed in each safety protector 306D. The trench 306T has a long-strip structure, and the trench 306T is communicated with the gas source 500 through the communicating path 306L.

When the control module 107 detects and determines that the first power source PS1 does not provide the electrostatic chuck 304 with electricity, the control module 107 controls the gas source 500 to eject the gas through the communicating path 306L and the trench 306T onto the reticle 200 along the arrow direction in FIG. 15, so as to prevent the reticle 200 from falling downward and being in contact with other elements. Based on the design of the trench 306T, the reticle 200 can be pushed upward by a greater amount of the gas through the long-strip trench 306T, so that the reticle 200 can stably remain in the original position or can be stably levitated on a position between the electrostatic chuck 304 and the safety protectors 306D.

Figure 16:
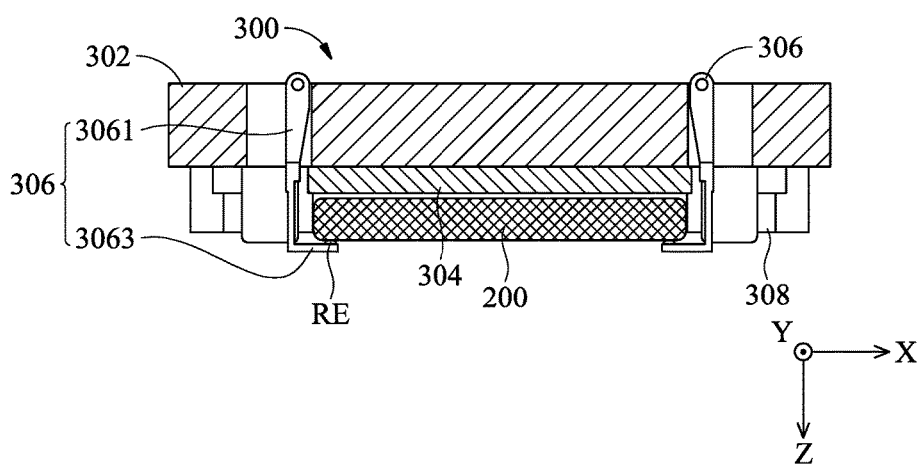
FIG. 16 is a diagram of the reticle and the reticle stage when viewed along the Y-axis according to some embodiments of the disclosure.

Please refer to FIG. 16, which is a diagram of the reticle 200 and the reticle stage 300 when viewed along the Y-axis according to some embodiments of the disclosure. This embodiment is similar to the embodiment of FIG. 5, but the difference between these two embodiments is that a buffering element RE is disposed on the bent portion 3063 of the safety protector 306. (In some embodiments, a safety protecting device is defined to include the safety protector 306 and the buffering element RE. The buffering element RE can be made of some resilient materials, such as being made of polymer. Therefore, when the first power source PS1 does not provide the electrostatic chuck 304 with electricity and the reticle 200 falls downward, the buffering element RE can cushion the fall of reticle 200. It should be noted that the buffering element RE has a property of sticking particles, so that even though the reticle 200 is contact with the buffering element RE and results in some particles, those particles can be stuck by the buffering element RE. That is, no particle falls on the semiconductor wafer 400 and the defect on the semiconductor wafer 400 due to the particle in the lithography process can be prevented, so as to increase the yield rate of the semiconductor wafer 400.

Figure 17:
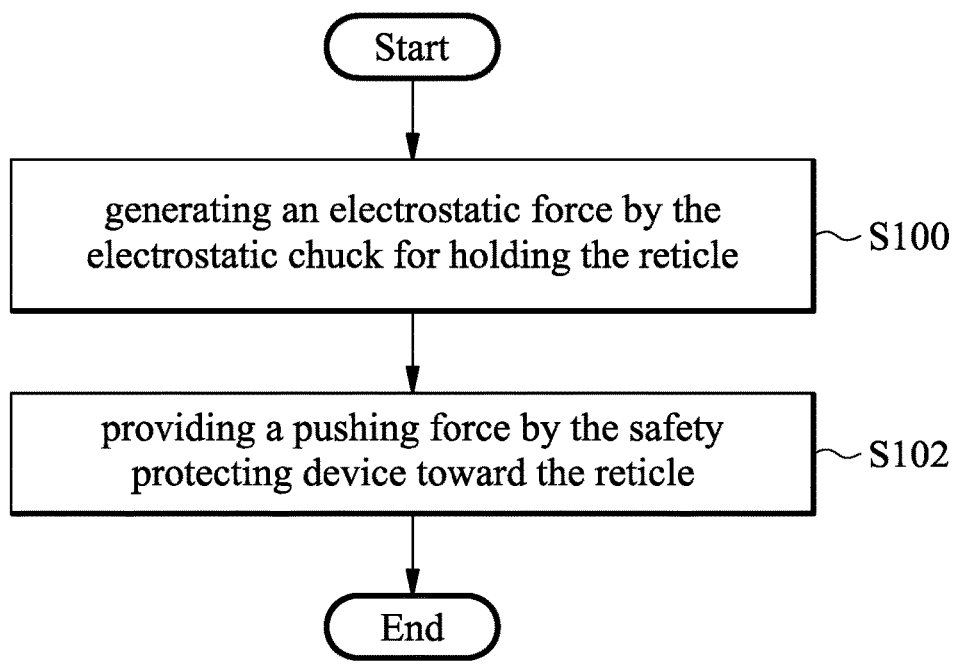
FIG. 17 is a flowchart of a method for protecting the reticle according to some embodiments of the disclosure.

Please refer to FIG. 17, which is a flowchart of a method for protecting the reticle 200 according to some embodiments of the disclosure. In operation S100, the electrostatic chuck 304 generates an electrostatic force for holding or securing the reticle 200, and the electrostatic chuck 304 is provided electricity by a first power source PS1. In operation S102, a safety protecting device provides a pushing force toward the reticle 200. For example, the pushing force toward the first surface 205 of the reticle 200. In some embodiment, the safety protecting device includes multiple safety protectors and multiple second magnetic elements disposed on the safety protectors, and a magnetic rejection force (i.e., the pushing force) is generated by the second magnetic elements and corresponding first magnetic elements on the reticle 200, so as to maintain the reticle 200 on a position between the electrostatic chuck 304 and the safety protectors when the electrostatic force generated by the electrostatic chuck 304 is interrupted or stopped.

In some embodiments, the pushing force can be generated by gas. For example, the safety protecting device shown in FIG. 10 can eject the gas from the gas source 500 to the first surface 205 of the reticle 200. The gas source 500 is provided to eject a gas, and the gas source 500 is communicated with the safety protector. In some embodiments, the control module 107 monitors whether the first power source PS1 provides the electrostatic chuck 304 with electricity or not. When the first power source PS1 does not provide the electrostatic chuck 304 with electricity, the control module 107 controls the gas source 500 to eject the gas through the safety protector onto the reticle 200, so as to levitate the reticle 200 on a position between the electrostatic chuck 304 and the safety protector. In some embodiments, no matter whether the first power source PS1 provides the electrostatic chuck 304 with electricity or not, the control module 107 controls the gas source 500 to continuously eject the gas through the safety protector onto the reticle 200, so as to maintain the reticle 200 in the position between the electrostatic chuck 304 and the safety protector.

In conclusion, the disclosure provides a semiconductor fabricating system which includes a reticle stage for holding a reticle. The reticle stage includes an electrostatic chuck and a safety protector. In some embodiments, a first magnetic element and a second magnetic element are respectively disposed on the reticle and the safety protector, and the magnetic poles of first magnetic element and the second magnetic element are the same. When the electrostatic chuck cannot hold the reticle by electrostatic force, the reticle is maintained in the position between the electrostatic chuck and the safety protector by the magnetic rejection force. In some embodiments, the semiconductor fabricating system further includes a gas source and a control module. When the electrostatic chuck cannot hold the reticle by electrostatic force, the control module controls the gas source to eject the gas onto the reticle, so as to levitate the reticle in the position between the electrostatic chuck and the safety protector.

Due to these designs of the disclosure, when the electrostatic force generated by the electrostatic chuck 304 is interrupted or stopped, the reticle is not in contact with the safety protector, and there are no particles resulting from the friction between the reticle and the safety protectors. Thus, contamination of the reticle and the semiconductor wafer can be avoided or mitigated, and the defect on the semiconductor wafer due to the particle in the lithography process can be prevented, so as to increase the yield rate of the semiconductor wafer. In addition, because there is no particle falling on the reticle or the semiconductor wafer, waste time for cleaning a contaminated reticle and a contaminated semiconductor wafer can be saved, and the yield rate and the throughput of semiconductor wafers utilized by the reticle for processing is also increased.

In accordance with some embodiments, a lithography apparatus is provided. The lithography apparatus includes a reticle stage. The reticle stage includes a main base, an electrostatic chuck and a safety protecting device. The electrostatic chuck is disposed on the main base and configured to generate an electrostatic force for holding a reticle. The safety protecting device is connected to the main base and is configured to generate a pushing force toward the reticle when the electrostatic force generated by the electrostatic chuck is interrupted.

In accordance with some embodiments, a lithography apparatus is provided. The lithography apparatus includes a wafer stage and a reticle stage. The wafer stage is configured to hold a wafer, and the electrostatic chuck faces a first surface of the reticle. The reticle stage is disposed over the wafer stage and includes an electrostatic chuck and a safety protecting device. The electrostatic chuck is configured to hold the reticle. The safety protecting device is configured to generate a pushing force toward a second surface of the reticle when the electrostatic force generated by the electrostatic chuck is interrupted. The first surface and the second surface are located on two opposite sides of the reticle.

In accordance with some embodiments, a method for protecting a reticle is provided. The method includes generating an electrostatic force by an electrostatic chuck for holding the reticle. The method further includes providing a pushing force by a safety protecting device toward the reticle, so as to levitate the reticle between the electrostatic chuck and the safety protecting device when the electrostatic force generated by the electrostatic chuck is interrupted.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A lithography apparatus, comprising:
   a reticle stage, comprising:
   a main base;
   an electrostatic chuck, disposed on the main base and configured to generate an electrostatic force for holding a reticle; and
   a safety protecting device, connected to the main base and configured to generate a non-contact pushing force toward the reticle when the electrostatic force generated by the electrostatic chuck is interrupted.

2. The lithography apparatus as claimed in claim 1, wherein the pushing force is a magnetic rejection force generated by the safety protecting device and the reticle.

3. The lithography apparatus as claimed in claim 1, wherein the reticle is made of a non-magnetic material.

4. The lithography apparatus as claimed in claim 1, wherein the reticle includes a plurality of first magnetic elements, and the safety protecting device comprises:
   a plurality of safety protectors, each comprising:
   a connecting portion, connected to the main base and extending in a first direction; and
   a bent portion, connected to the connecting portion, and extending in a second direction that is different from the first direction; and
   a plurality of second magnetic elements, corresponding to the plurality of first magnetic elements, wherein the second magnetic elements are respectively disposed on the bent portions and face the first magnetic elements;
   wherein the magnetic poles of the first magnetic elements and the second magnetic elements facing each other are the same.

5. The lithography apparatus as claimed in claim 4, wherein the reticle comprises a rectangular structure, and the reticle comprises four first magnetic elements disposed on four corners of the reticle, and the safety protecting device comprises four safety protectors corresponding to the four first magnetic elements.

6. The lithography apparatus as claimed in claim 4, wherein the reticle comprises a first surface and a second surface, the first surface and the second surface are located on two opposite sides of the reticle, and the first magnetic elements are disposed on the first surface which faces the safety protectors or are disposed on the second surface which faces the electrostatic chuck.

7. The lithography apparatus as claimed in claim 4, wherein the first magnetic elements and the second magnetic elements are configured to generate a magnetic rejection force to levitate the reticle between the electrostatic chuck and the safety protector when the electrostatic force generated by the electrostatic chuck is interrupted.

8. The lithography apparatus as claimed in claim 1, wherein the reticle stage further comprises a plurality of constraining portions, configured to constrain the reticle along a plane that is parallel to the electrostatic chuck.

9. The lithography apparatus claimed in claim 8, wherein the constraining portions are made of a resilient material.

10. The lithography apparatus as claimed in claim 1, wherein the pushing force is generated by gas ejected onto the reticle from the safety protecting device.

11. The lithography apparatus as claimed in claim 10, wherein the safety protecting device comprises at least two gas outlets to eject gas onto two opposite sides of a surface of the reticle to generate the pushing force, wherein the surface faces a wafer stage.

12. The lithography apparatus as claimed in claim 10, wherein the safety protecting device comprises two safety protectors, each including:
   a connecting portion, connected to the main base and extending in a first direction; and
   a bent portion, connected to the connecting portion, extending in a second direction that is different from the first direction, and configured to eject the gas onto the reticle to generate the pushing force.

13. The lithography apparatus as claimed in claim 12, wherein the bent portion comprises one or more ejecting outlets communicated with a gas source through a gas tube, and configured to eject the gas onto the reticle.

14. The lithography apparatus as claimed in claim 12, wherein the reticle comprises a rectangular structure and a surface facing the safety protectors, and the two safety protectors correspond to two opposite sides of the surface of the reticle, and each of the bent portions comprises a long strip structure which is parallel to the reticle.

15. The lithography apparatus as claimed in claim 12, wherein each of the safety protectors comprises a trench and a communicating path, and the trench communicates with a gas source through the communicating path.

16. The lithography apparatus claimed in claim 10, further comprising:
   a gas source, configured to eject the gas; and
   a control module, configured to control the gas source to eject the gas onto the reticle to generate the pushing force when the electrostatic force generated by the electrostatic chuck is interrupted.

17. The lithography apparatus as claimed in claim 16, wherein the control module monitors whether a first power source provides the electrostatic chuck with electricity to generate the electrostatic force, and the control module controls the gas source to eject the gas onto the reticle when the first power source does not provide the electrostatic chuck with electricity.

18. The lithography apparatus as claimed in claim 17, wherein the lithography apparatus further comprises a second power source, configured to provide the gas source and the control module with electricity, and the second power source is independent from the first power source.

19. A lithography apparatus, comprising:
   a wafer stage, configured to hold a wafer; and
   a reticle stage, disposed over the wafer stage and comprising:
   an electrostatic chuck, configured to hold a reticle, wherein the electrostatic chuck faces a second surface of the reticle; and
   a safety protecting device, configured to generate a non-contact pushing force toward a first surface of the reticle when an electrostatic force generated by the electrostatic chuck is interrupted, wherein the first surface and the second surface are located on two opposite sides of the reticle.

20. A method for protecting a reticle, comprising:
   generating an electrostatic force by an electrostatic chuck for holding the reticle; and
   providing a non-contact pushing force by a safety protecting device toward the reticle, so as to levitate the reticle between the electrostatic chuck and the safety protecting device when the electrostatic force generated by the electrostatic chuck is interrupted.

* * * * *